(12) United States Patent
Oprysko et al.

(10) Patent No.: US 6,992,255 B2
(45) Date of Patent: Jan. 31, 2006

(54) VIA AND VIA LANDING STRUCTURES FOR SMOOTHING TRANSITIONS IN MULTI-LAYER SUBSTRATES

(75) Inventors: Modest Oprysko, Carmel, NY (US); Lei Shan, Yorktown Heights, NY (US); Jeannine M. Trewhella, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 313 days.

(21) Appl. No.: 10/620,733

(22) Filed: Jul. 16, 2003

(65) Prior Publication Data

US 2005/0011674 A1    Jan. 20, 2005

(51) Int. Cl.
*H01R 12/04* (2006.01)
*H05K 1/11* (2006.01)

(52) U.S. Cl. ........................... 174/262; 361/788

(58) Field of Classification Search ............... 361/788, 361/792–795; 174/262, 266, 255
See application file for complete search history.

(56) References Cited

U.S. PATENT DOCUMENTS

| | | | |
|---|---|---|---|
| 5,436,412 A * | 7/1995 | Ahmad et al. | 174/265 |
| 6,617,943 B1 * | 9/2003 | Fazelpour | 333/204 |
| 6,700,457 B2 * | 3/2004 | McCall et al. | 333/33 |
| 6,710,258 B2 * | 3/2004 | Oggioni et al. | 174/255 |

* cited by examiner

Primary Examiner—Kamand Cuneo
Assistant Examiner—Yuriy Semenenko
(74) *Attorney, Agent, or Firm*—Keusey, Tutunjian & Bitetto, P.C.; Anne V. Dougherty, Esq.

(57) ABSTRACT

An integrated circuit arrangement or package includes a set of contact pads arranged in a pattern and a multi-layer conductive structure, which electrically connects the set of contact pads to at least one signal line. The conductive structure provides impedance matching between the pads and the at least one signal line.

21 Claims, 10 Drawing Sheets

VIA AND VIA LANDING STRUCTURES FOR SMOOTHING TRANSITIONS IN MULTI-LAYER SUBSTRATES

BACKGROUND OF THE INVENTION

1. Field of the Invention

The present invention relates to integrated circuits, and more particularly to circuit structures, which provide smooth transitions in multi-layer substrates.

2. Description of the Related Art

Multi-layer structures often include a plurality of electrical connections. The metal lines or conductive landings between structures may or may not share a common layout scheme. In such structures, transitions and connections between these structures may prove difficult and are often a source of performance issues.

In multi-layer substrates such as a Ball Grid Array (BGA) package, via structures as well as transitions from a C4 or wirebond pitch (~225 um) to a BGA or other pin pitch (~1000 um) become the bottlenecks of electrical performance. These bottlenecks are compounded with ever increasing operating speed. A via size/spacing that is selected for matching a system characteristic impedance at the C4 or wirebond end of a package tends to result in much higher impedance at the BGA end. This impedance variation is detrimental particularly when via length is larger than 1/10 of a propagation wavelength, noting that the wavelength decreases with the increase in operating frequency.

For example, in a 2 mm thick alumina substrate, the critical frequency is about 5 GHz, and this critical frequency decreases with the increase of substrate thickness. Issues arise with 6 Gb/sec server and network switching links are emerging in the near future, and with many communication and testing applications targeting 40 Gb/sec and above.

SUMMARY OF THE INVENTION

An integrated circuit arrangement or package includes a set of contact pads arranged in a pattern and a multi-component conductive structure, which electrically connects the set of contact pads to at least one signal line. The conductive structure provides impedance matching between the pads and the at least one signal line.

These and other objects, features and advantages of the present invention will become apparent from the following detailed description of illustrative embodiments thereof, which is to be read in connection with the accompanying drawings.

BRIEF DESCRIPTION OF DRAWINGS

The invention will be described in detail in the following description of preferred embodiments with reference to the following figures wherein.

DETAILED DESCRIPTION OF PREFERRED EMBODIMENTS

Via structures and landings disclosed herein provide smooth transitions within multi-layer substrates. This assists in avoiding reduced performance due to operational frequency limitations. Multi-layer substrates may be employed in a variety of different applications, such as for example, packaging of semiconductor chips and chips set, integrated circuit boards with chips mounted thereon, chips having multiple substrates and related applications.

In one embodiment, pyramid vias and via landing structures are disclosed to provide smooth via and pitch transitions within multilayer substrates. These provide substantially continuous impedance structures and therefore extend existing packaging solutions to much higher frequency applications. The disclosed structures are fully compatible with existing substrate manufacturing processes with little or no additional costs for implementation.

Figure 1:
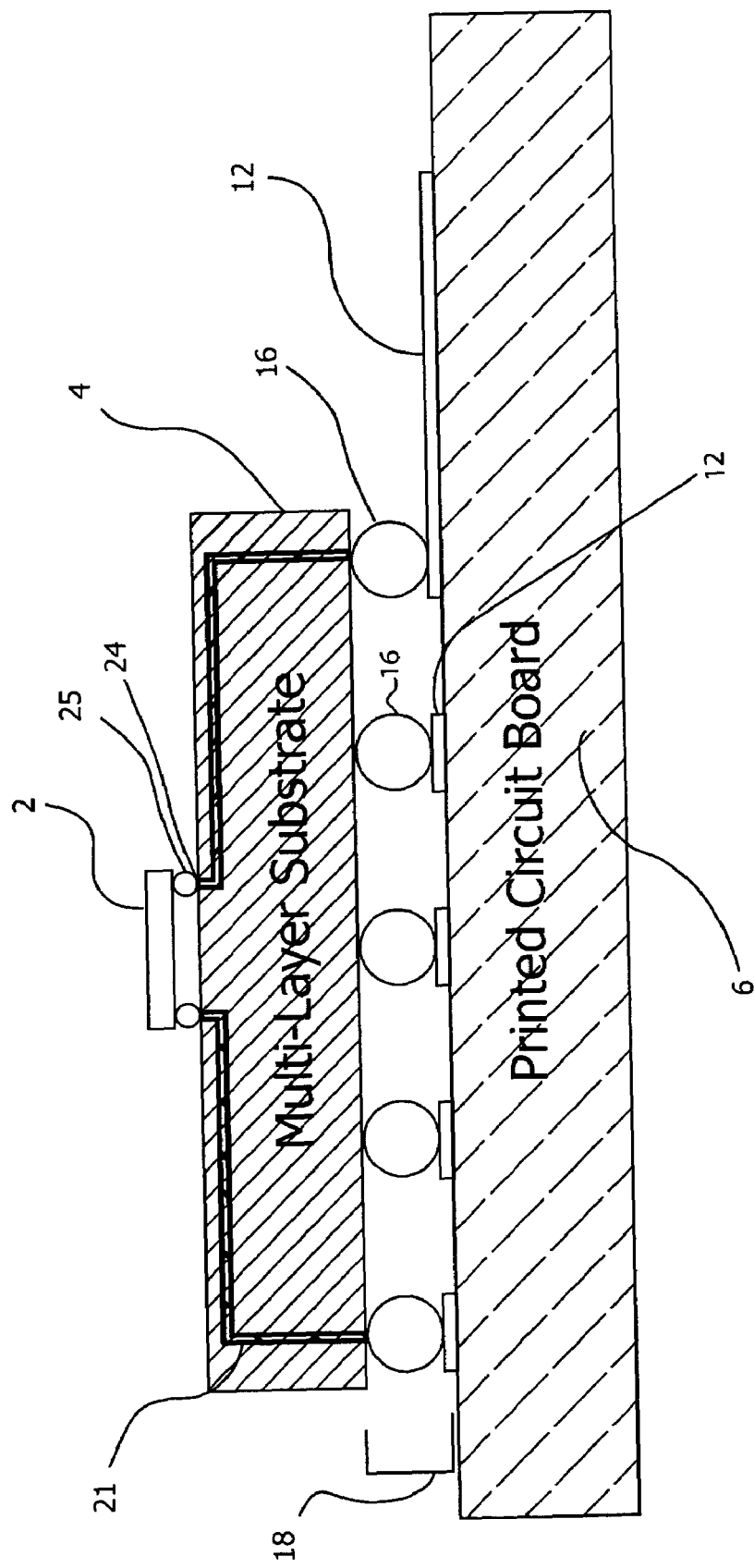
FIG. 1 is an illustrative side view of a chip mounted on a printed wiring board in accordance with the present disclosure.

Referring now in detail to the figures in which like numerals represent the same or similar elements and initially to FIG. 1, an illustrative chip mounting setup is illustratively shown. A chip 2, for example, a semiconductor chip, is mounted or otherwise connected to a multi-layer substrate 4 through transmission lines 24, which connect to C4 joints 25. Multi-layer substrate 4 includes via structures 21 which connect to BGA joints 16. The present invention will illustrate a plurality of different via structures for multiplayer substrate 4. Joints 16 provide an electrical path to conductive structures 12 formed on a printed wiring board 6. The setup shown in FIG. 1 is illustrative of one setup that can benefit from the embodiments of present disclosure. Other embodiments and setup are also contemplated.

Figure 2:
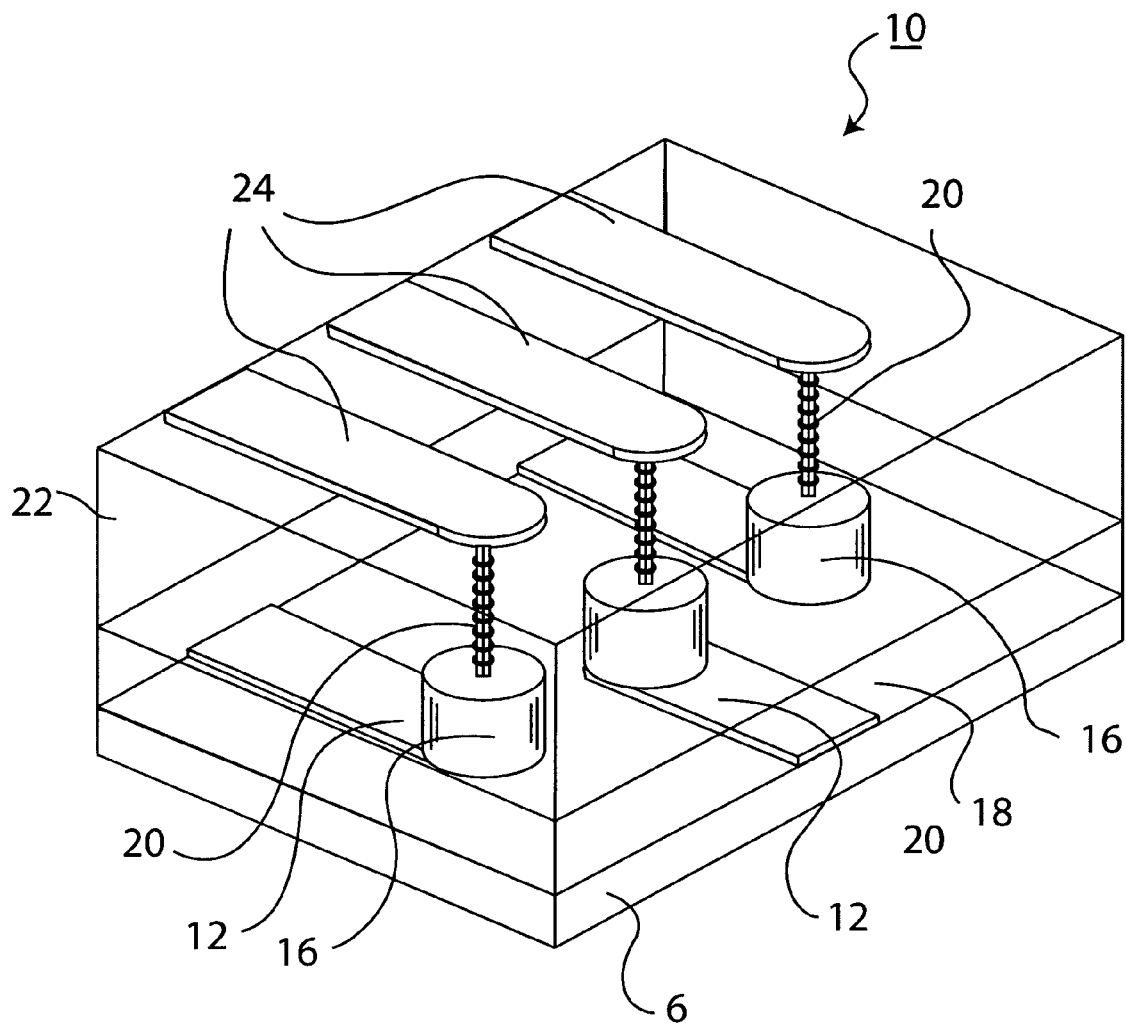
FIG. 2 is a perspective view of a standard via structure for connecting contacts to pads in accordance with the prior art.

Referring to FIG. 2, standard via and landing structures are for multi-layer substrate 4 shown in accordance with the prior art to provide a comparison to the structures of the present disclosure. Metal lines or waveguides 12 are provided on a printed wiring board (PWB) 6. BGA joints 16 are formed connecting to lines 12 and are depicted as cylinders in FIG. 2. A dielectric or air gap 18 is provided as a standoff for BGA joints 16. Vias 20 are formed through dielectric layer 22. Transmission lines 24 (which connect to C4 joints 25) are connected to vias 20. At higher frequency operations of structure 10, performance degradation is experienced due to impedance mismatches as a result of the size discrepancies between vias 20 and connected conductors (e.g., joints 16, lines 12 and lines 24). While this structure is relatively easy to manufacture, the structures is less compatible with high-speed operations.

Illustrative embodiments will now be described with reference to FIGS. 3–7. While these embodiments are illustrative of the concepts of the present disclosure, they should not be construed as limiting the present disclosure.

Figure 3:
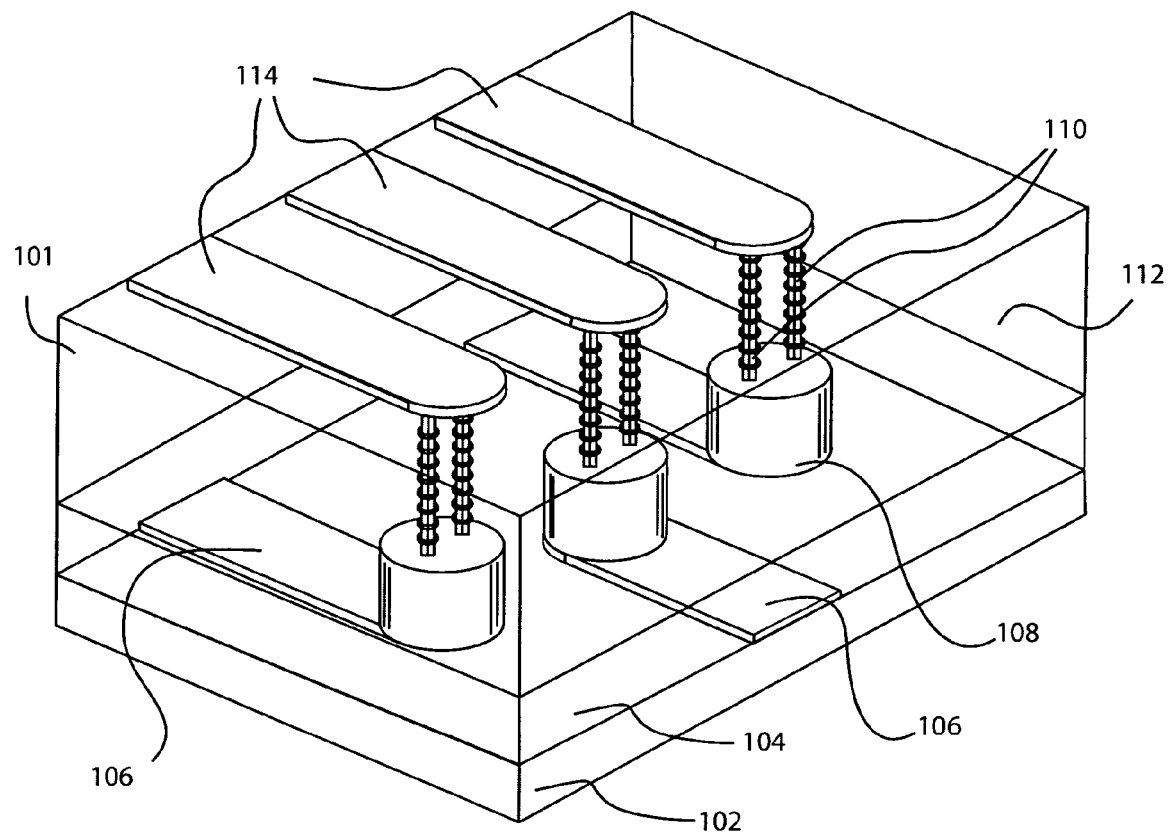
FIG. 3 is a perspective view of a double via structure for connecting contacts to pads in accordance with the present disclosure.

Referring to FIG. 3, one embodiment, which may be called a double via structure, is shown. Metal lines or waveguides 106 are provided on a first substrate 102. Substrate 102 may include, for example, a PWB or other structure. Via landings or joints 108 are connected to lines 106, which be formed on substrate 102. A dielectric or air gap 104 is provided as a standoff to permit landings (108) to be connectable to vias 110 formed through dielectric layer 112. Vias 110 are doubled-up within multiplayer stack 101 in this embodiment, that is, two for each landing 108. It is also contemplated that more than two vias 110 be provided for each landing 108. Vias 110 may each include a 660 μm long, 62 μm diameter via. Other sizes may also be employed.

At the top of via structures 110, a finite ground plane coplanar waveguide (CPW) 114, e.g., a 50-Ohm transmission line, is employed to connect to C4 joints of a chip (not shown) to the vias 110. Transmission lines 114 may include a signal line surrounded by two ground lines, may include two signal lines or any other combination of ground lines and signal line or lines.

The double via structure is employed on each interconnect to lower via inductance and to increase via coupling capacitance, which adjusts the characteristic impedance (e.g., towards 50 Ohm) and therefore improves impedance match.

Figure 4:
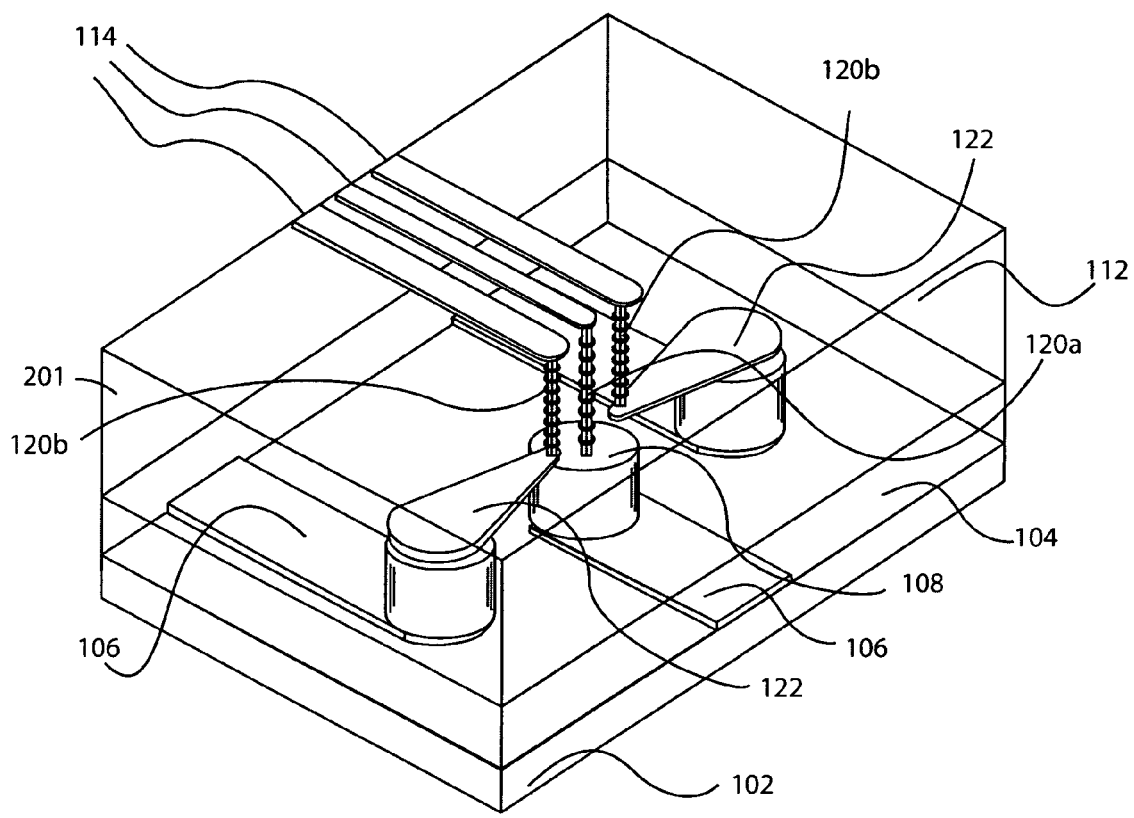
FIG. 4 is a perspective view of a direct via structure for connecting contacts to pads in accordance with the present disclosure.

Referring to FIG. 4, a direct via structure is illustratively shown. In this multi-layer structure 201, vias 120a and 120b are over or in close proximity of landings 108. Adjacent landings 108 include a teardrop or other gradual-shaped conductor 122 to permit vias 120a to be located closer to via 120a. In this way, vias 120a and 120b are located close to one another to affect the capacitive coupling therebetween. Parallel Ground-Signal-Ground (GSG) vias (to lines 114, which are ground, signal, and ground in this illustrative example) are spaced so that a given impedance is obtained (e.g., 50 Ohm). Teardrop-shaped conductors 122 are used to fan-out the ground via to corresponding pads/landings 108 to minimize coupling capacitance.

Figure 5:
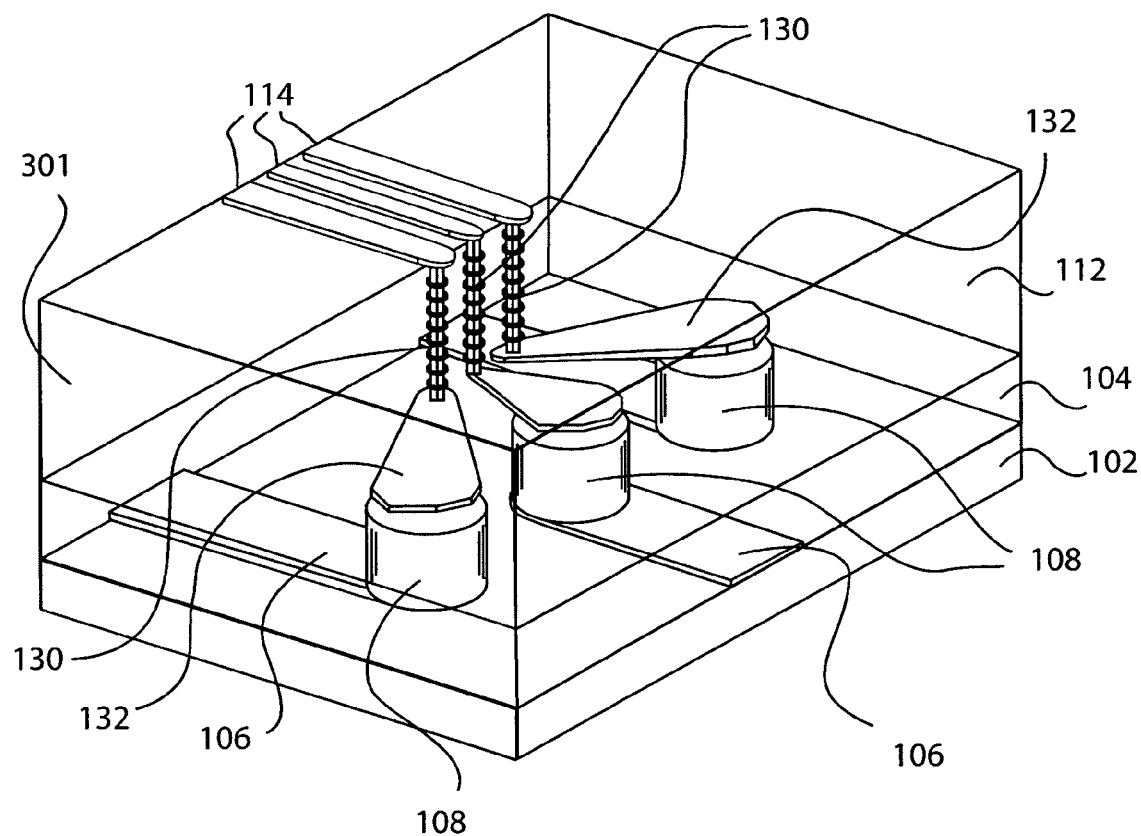
FIG. 5 is a perspective view of an offset via structure for connecting contacts to pads in accordance with the present disclosure.

Referring to FIG. 5, an offset via multi-layer structure 301 is illustratively shown. This structure is similar to the direct via structure of FIG. 4; however, the vias 130 are offset from a centrally located landing 108 by conductors 132. The "offset via" is similar to the "direct via" except that the via 130 lands in between two rows of landing pads or joints 108 (a second row of pads 108 not shown). A short taper CPW-like structure 132 is inserted to smooth the transition with continuous impedance.

Figure 6:
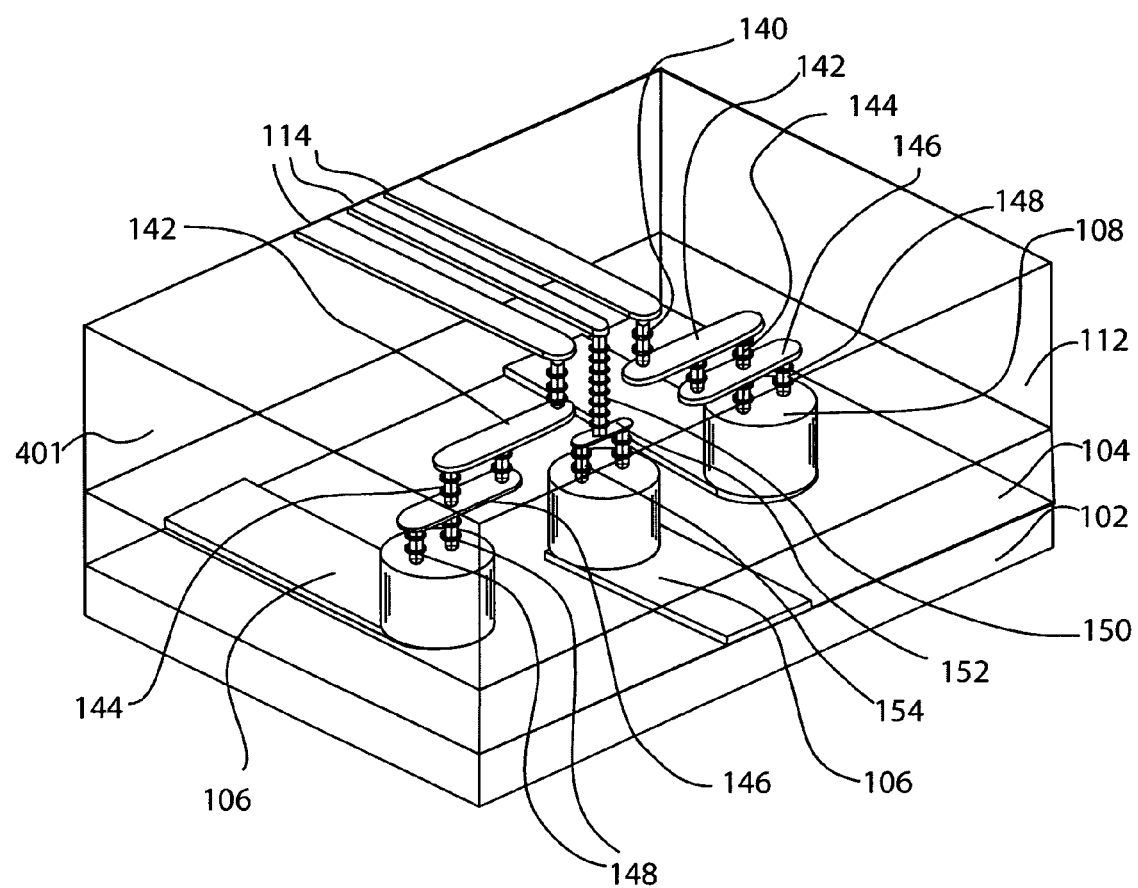
FIG. 6 is a perspective view of an inline pyramid via structure for connecting contacts to pads in accordance with the present disclosure.

Referring to FIG. 6, an inline pyramid via structure 401 is illustratively shown. This structure remains in-line over landing pads or joints 108. In the embodiment shown, double vias 148 and 154 (more vias may be employed) make contact with pads 108. An intermediate level conductor 146 is patterned to connect vias 148 to vias 144. Vias 144 are then connected to conductors 142, and vias 140 connect to line 114. The conductive path of the outer landing pads 108 is moved more centrally in a step-wise manner using a series of vias (140, 144) and conductive connections (142, 146). It should be noted that a greater number (or lesser number) of conductive steps/layers may be employed to achieve improved results over the prior art. Two or more vias may be employed at each connection point although only one or two are illustrated in FIGS. 3–7.

Over centrally disposed pads 108, a conductive path including vias 150 and 154 and conductor 152 is formed to connect to a centrally disposed line 114. In the case of an inline pyramid structure 401, the impedance control is achieved through vertical via stack structures, which increase the number of vias as the spacing grows down toward pads/joints 108.

Figure 7:
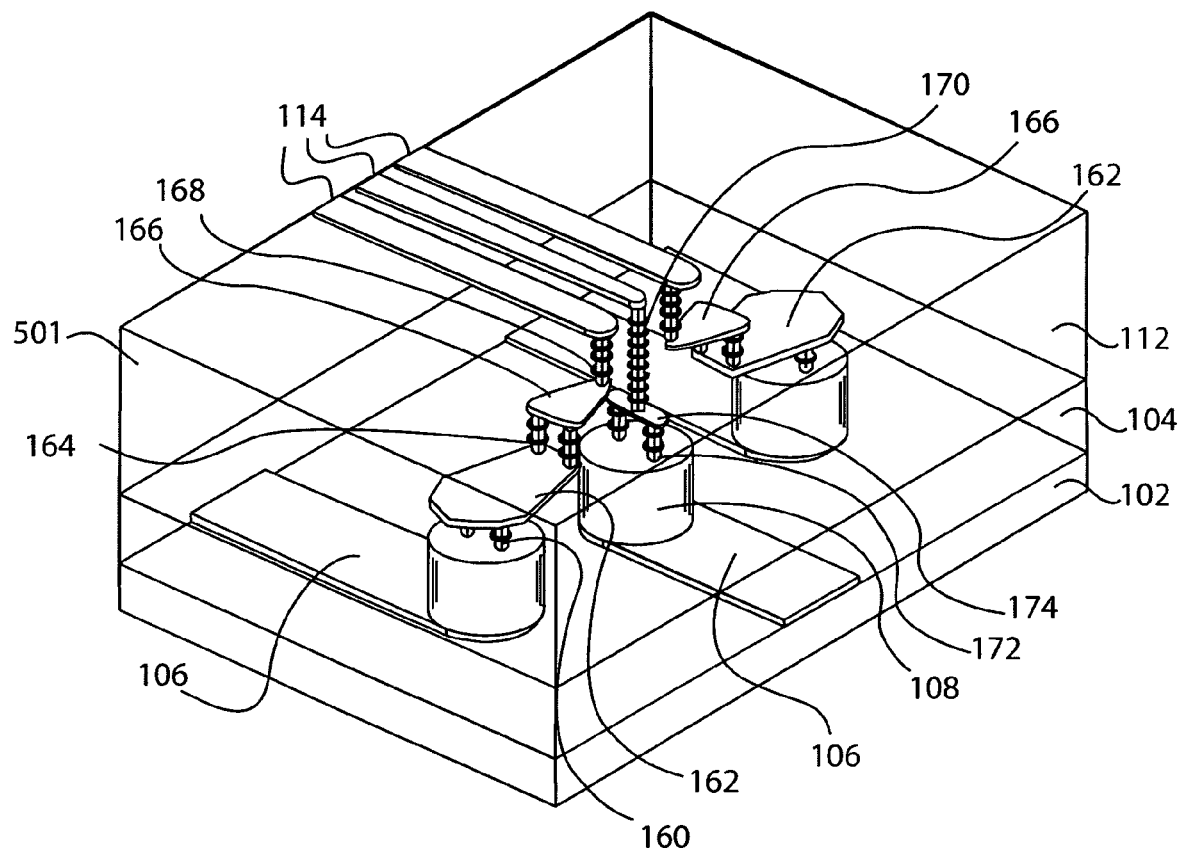
FIG. 7 is a perspective view of a parallel pyramid via structure for connecting contacts to pads in accordance with the present disclosure.

Referring to FIG. 7, a parallel pyramid via structure 501 is illustratively shown. This structure remains in-line over landing pads 108; however, via pairs 160, 164 and 172 remain in a parallel orientation to lines 114. In the embodiment shown, double vias 160 and 164 (more vias may be employed) make contact with pads 108. An intermediate level conductor 162 is formed to connect vias 160 to vias 164. Vias 164 are then connected to conductors 166, and vias 168 connect to line 114. The conductive path of the outer landing pads 108 is placed more centrally in a step-wise manner using a series of vias (160, 164, 168) and conductive connections (162, 166). It should be noted that a greater number (or lesser number) of conductive steps/layers may be employed to achieve improved results over the prior art. Two or more vias may be employed at each connection point although only one or two are illustrated in FIGS. 3–7.

Over a centrally disposed pad 108, a conductive path including vias 170 and 172 and conductor 174 is formed to connect to a centrally disposed line 114. In the case of parallel pyramid, the impedance control is achieved through vertical via stack structures, which increase the number of vias as the spacing grows down toward pads 108.

Figure 8:
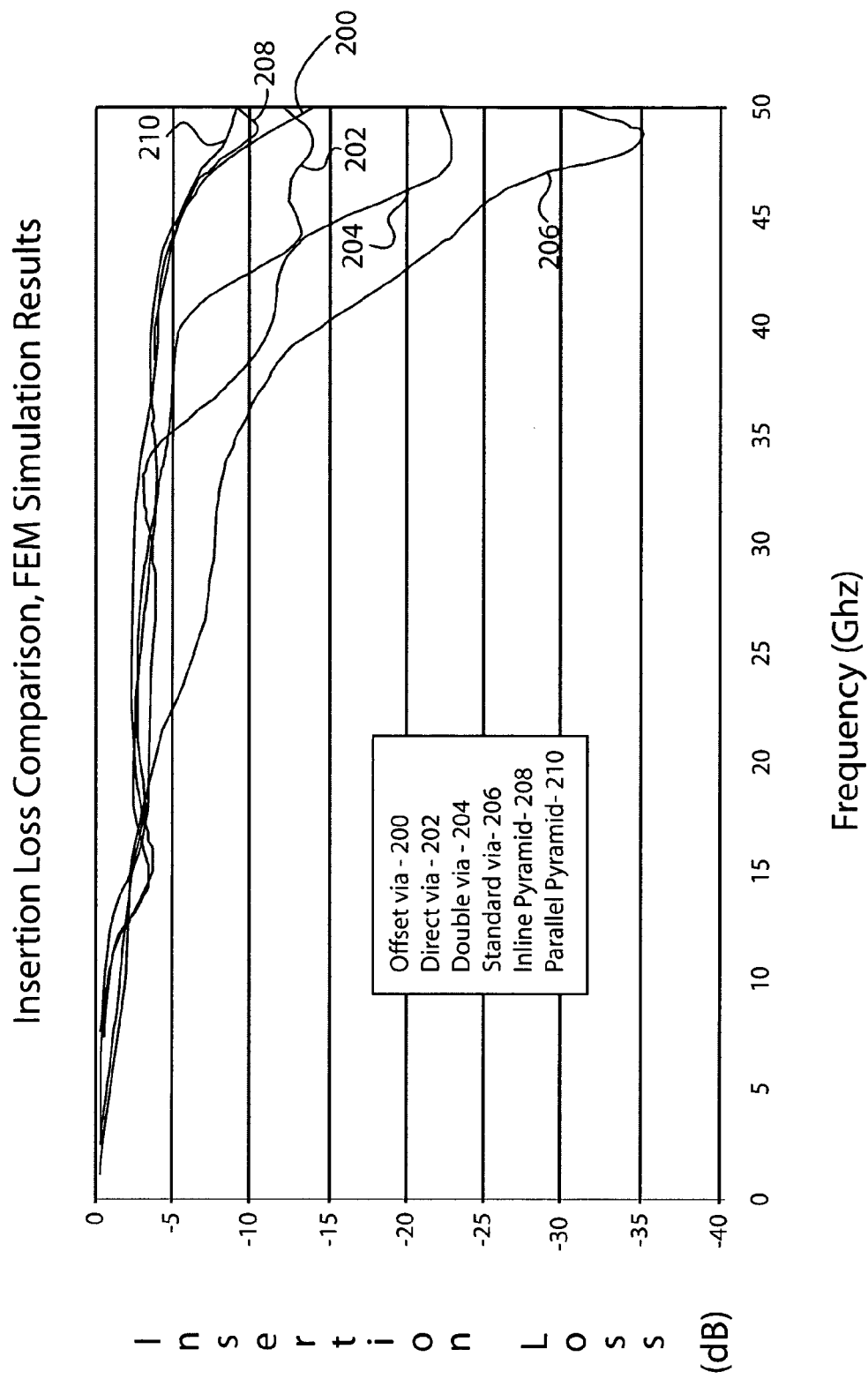
FIG. 8 is a chart showing insertion loss versus frequency for the structures of FIGS. 2–7.

Referring to FIG. 8, the illustrative via structures of this disclosure, including double via, direct via, offset via, inline pyramid, and parallel pyramid were modeled and tested by the inventors. To various extents, high frequency performances were improved over a standard via layout according to both simulation and measurement results.

As an example to demonstrate the improvement, FIG. 8 includes the models of these five via structures compared with a standard via layout. FIG. 8 shows insertion loss (dB) versus Frequency (GHz) curves for a standard via 206, double via 204, direct via 202, offset via 200, inline pyramid 208, and parallel pyramid 210.

For the multi-layer stack, an 8-layer stack alumina substrate and 660 μm long 62 μm diameter vias were used for the model setup. At the top of these via structures, a 50 Ohm finite ground plane coplanar waveguide (CPW) was adopted to connect C4 joints of a chip to the vias, and a 50 Ohm microstrip line on an organic test card was used to connect the BGA balls to coaxial connectors. (see e.g., FIG. 1)

A performance comparison based on 3D FEM (HFSS) simulation results (FIG. 8) conveys the insertion loss in dB as a measure of signal power loss over the modeled structures. In this case, −5 dB or 70% power loss is used to estimate the improvement of the disclosed structures over standard via layout (206). Compared with the 23 GHz of standard via layout, the frequency response is surprisingly increased up to 36 GHz for double via 204, 40 GHz for direct via 202, and 45 GHz for the rest of the three structures (offset via 200, inline pyramid 208, and parallel pyramid 210).

The improvement is significant and provides for the implementation of high speed interconnects using existing packaging solutions. For those applications with more layer stacks and thicker substrates, the improvement should be even more pronounced over standard via layout when moving towards the lower frequency range.

Figure 9:
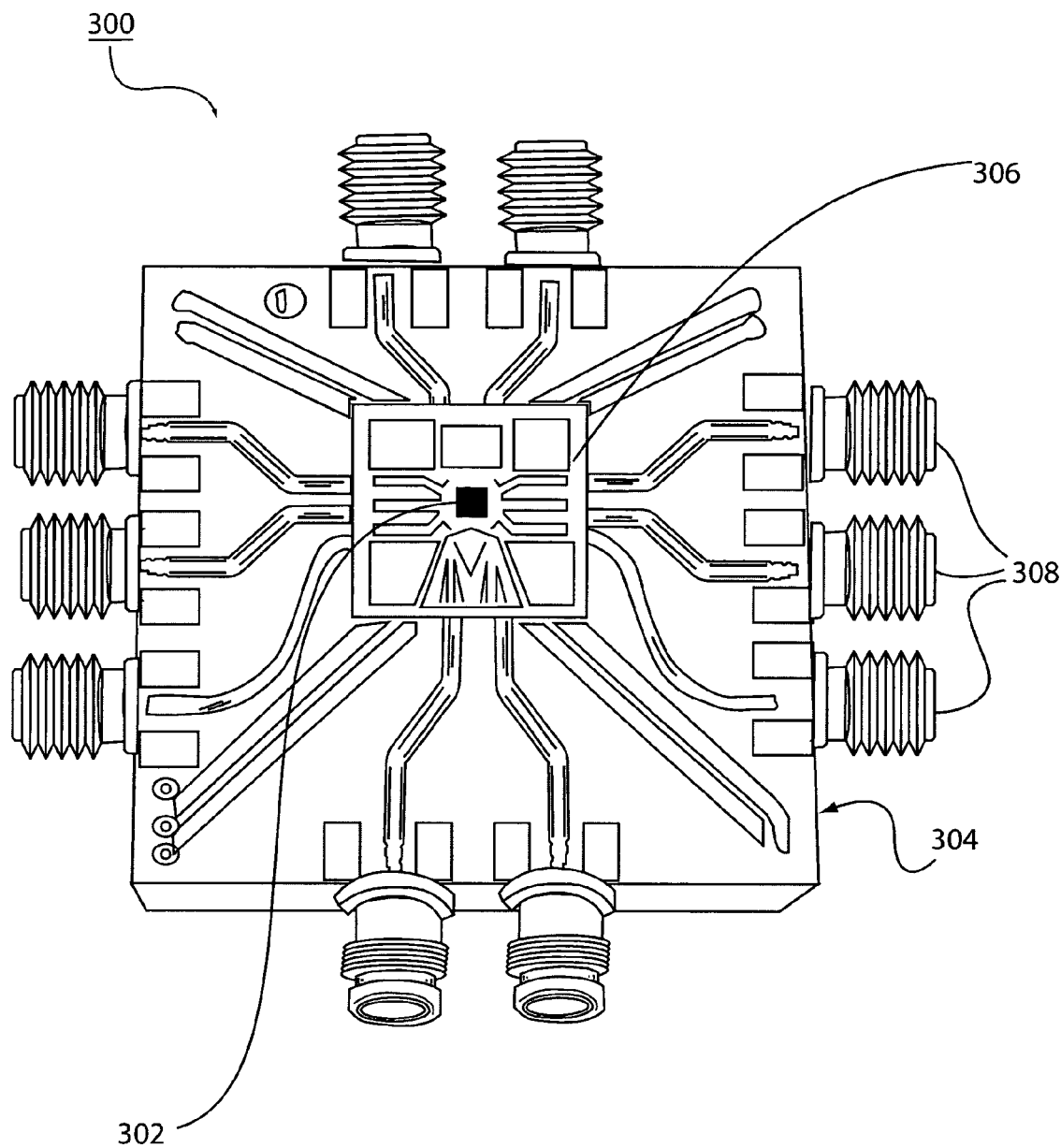
FIG. 9 is a view of a test configuration used to obtain the data of FIG. 8.
Figure 10:
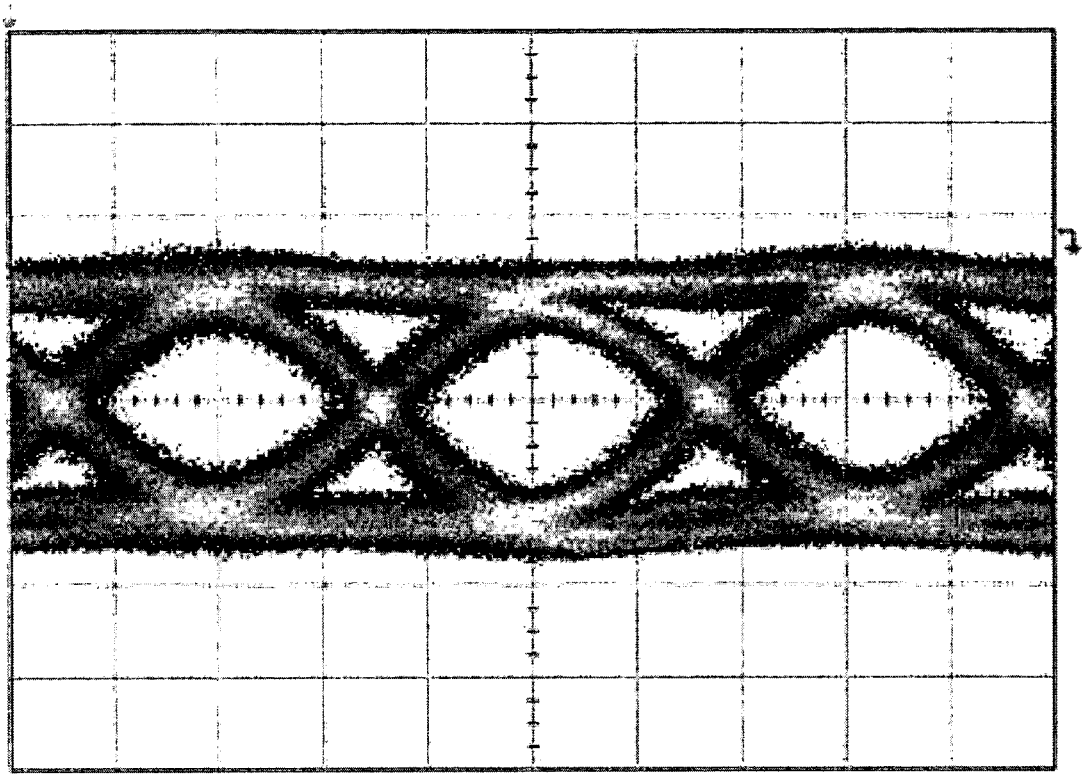
FIG. 10 is an eye-chart showing error free operation using the structures of the present disclosure.

Referring to FIGS. 9 and 10, in addition to the insertion loss measurements on prototype packages, which support the observations from simulations (e.g., FIG. 8), an assembled package 300 with a multiplexer circuit chip 302 (FIG. 9) and a test carrier 304 was operated at 40 Gb/sec data rate free of error. An 8-layer stack alumina substrate 306

(below chip 302) with 660 μm long 62 μm diameter vias were used for the multi-layer setup. At the top of these via structures, a 50 Ohm finite ground plane coplanar waveguide (CPW) was adopted to connect C4 joints of a chip to the vias (see also FIG. 1), and a 50 Ohm microstrip line on an organic test card 304 was used to connect BGA balls (FIG. 1) to coaxial connectors 308.

A 40 Gb/sec eye-diagram (FIG. 10) is shown at the output of the test carrier, and as reported, through low cost commercial packages, error-free high frequency operation can be performed in accordance with the present disclosure.

The multi-layer transition stack structures of the present disclosure provide alterative impedance magnitudes, which can be matched to the chips and PWB in accordance with the needed characteristics. The stack may be optimized to the requirements of each chip/PWB combination, and the structure and its characteristics, e.g., impedance, geometry (thickness and electrical connection positions), etc. may be determined and selected for each situation.

Having described preferred embodiments of a via and via landing structures for smoothing transitions in multi-layer substrates (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. An integrated circuit arrangement, comprising:
   a set of contact pads arranged in a pattern;
   a multi-layer conductive structure which electrically connects the set of contact pads to at least one signal line, wherein the conductive structure provides impedance matching between the pads and the at least one signal line; the conductive structure is multi-tiered and includes conductors disposed in a parallel orientation to a top surface of the pads, and vias connecting the conductors to the signal line and the pads; wherein the multi-tiered conductive structure includes a pyramidal shape having its base at the pads.

2. The arrangement as recited in claim 1, wherein the set of contacts includes a row of spaced apart pads having a first pitch.

3. The arrangement as recited in claim 2, wherein the signal line includes at least two signal lines spaced apart having a second pitch, wherein the conductive structure provides a smooth impedance transition between the signal lines and the pads.

4. The arrangement as recited in claim 3, wherein the first pitch and the second pitch are standard pitches and the transition of the conductive structure enables operating frequencies 50% or more over standard via connections.

5. The arrangement as recited in claim 1, wherein the conductive structure includes two vias on each contact pad.

6. The arrangement as recited in claim 1, wherein the conductive structure includes a conductor disposed in a parallel orientation to a top surface of the pads, and a via connecting the conductor to the signal line.

7. An integrated circuit arrangement, comprising:
   a set of contact pads arranged in a pattern;
   a multi-layer conductive structure which electrically connects the set of contact pads to at least one signal line, wherein the conductive structure provides impedance matching between the pads and the at least one signal line; the conductive structure is multi-tiered and includes conductors disposed in a parallel orientation to a top surface of the pads, and vias connecting the conductors to the signal line and the pads; wherein the multi-tiered conductive structure includes a plurality of vias at each connection point between conductors and/or pads wherein adjacent vias at a same tier are oriented one behind the other in a parallel direction with respect to the at least one signal line.

8. An integrated circuit arrangement, comprising:
   a set of contact pads arranged in a pattern;
   a multi-layered conductive structure which electrically connects the set of contact pads to at least one signal line, wherein the conductive structure includes vertically disposed vias and horizontally disposed conductors arranged and shaped to provide impedance matching between the pads and the at least one signal line; the conductive structure is multi-tiered and includes conductors disposed in a parallel orientation to a top surface of the pads, and vias connecting the conductors to the signal line and the pads, the multi-tiered conductive structure includes a plurality of vias at each connection point between conductors and/or pads wherein adjacent vias at a same tier are oriented one behind the other in a parallel direction with respect to the at least one signal line.

9. The arrangement as recited in claim 8, wherein the set of contact pads includes a row of spaced apart pads having a first pitch.

10. The arrangement as recited in claim 9, wherein the signal line includes at least two signal lines spaced apart having a second pitch, wherein the conductive structure provides a smooth impedance transition between the signal lines and the pads.

11. The arrangement as recited in claim 10, wherein the first pitch and the second pitch are standard pitches and the transition of the conductive structure enables operating frequencies 50% or more over standard via connections.

12. The arrangement as recited in claim 8, wherein the conductive structure includes two vias connecting to each contact pad.

13. The arrangement as recited in claim 8, wherein the conductive structure includes the conductors disposed in a parallel orientation to a top surface of the pads.

14. An integrated circuit arrangement, comprising:
    a set of contact pads arranged in a pattern;
    a multi-layered conductive structure which electrically connects the set of contact pads to at least one signal line, the conductive structure includes vertically disposed vias and horizontally disposed conductors arranged and shaped to provide impedance matching between the pads and the at least one signal line; the conductive structure is multi-tiered and includes conductors disposed in a parallel orientation to a top surface of the pads, and vias connecting the conductors to the signal line and the pads, wherein the multi-tiered conductive structure includes a pyramidal shape having its base at the pads.

15. An integrated circuit package, comprising:
    a set of dielectric layers having a top surface;
    a top contact array on the top surface;
    a conductive structure extending between the top contact array and a set of output contacts, the conductive structure is multi-tiered and includes conductors and vias connecting the conductors to the output contacts and the contact array and the multi-tiered conductive structure includes a pyramidal shape having its base at the pads, wherein a signal travels on a path from the top contact array to the set of output contacts, and an impedance is balanced on the path of the signal in accordance with the conductive structure.

16. The package as recited in claim 15, wherein the set of output contacts are disposed in a row a first spacing pitch.

17. The package as recited in claim 16, wherein the contact array includes a second spacing pitch, wherein the conductive structure provides a smooth impedance transition between the contact array and the output contacts.

18. The package as recited in claim 17, wherein the first pitch and the second pitch are standard pitches and the transition of the conductive structure enables operating frequencies 50% or more over standard via connections.

19. The package as recited in claim 15, wherein the contact array includes a centrally disposed pad and two pads adjacent to the centrally disposed pad, wherein the two pads connect to the conductive structure each by a conductor disposed in a parallel orientation to a top surface of the two pads, and vias connecting each conductor to output contacts, wherein each conductor brings a connection point to a corresponding via closer to the centrally disposed pad.

20. The package as recited in claim 19, wherein the centrally disposed pad includes a conductor, and the pads are in a row and the conductors and their corresponding vias are offset from a line in the row.

21. An integrated circuit package, comprising:

a set of dielectric layers having a top surface;

a top contact array on the top surface;

a conductive structure extending between the top contact array and a set of output contacts, the conductive structure is multi-tiered and includes conductors and vias connecting the conductors to the output contacts and the contact array, wherein the multi-tiered conductive structure includes a plurality of vias at each connection point between conductors, output contacts and/or the contact array wherein adjacent vias at a same tier are oriented one behind the other in a parallel direction with respect to the at least one signal line; and wherein a signal travels on a path from the top contact array to the set of output contacts, and an impedance is balanced on the path of the signal in accordance with the conductive structure.

* * * * *